(12) United States Patent
Jakobs et al.

(10) Patent No.: US 7,061,784 B2
(45) Date of Patent: Jun. 13, 2006

(54) SEMICONDUCTOR MEMORY MODULE

(75) Inventors: Andreas Jakobs, München (DE);
Hermann Ruckerbauer, Moos (DE);
Maksim Kuzmenka, München (DE)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 10/886,814

(22) Filed: Jul. 8, 2004

(65) Prior Publication Data
US 2005/0024963 A1    Feb. 3, 2005

(30) Foreign Application Priority Data
Jul. 8, 2003    (DE) ................................ 103 30 811

(51) Int. Cl.
*G11C 5/06*    (2006.01)
(52) U.S. Cl. ..................... 365/51; 365/63; 365/189.05; 365/233
(58) Field of Classification Search ..................... None
See application file for complete search history.

(56) References Cited

U.S. PATENT DOCUMENTS

| | | | |
|---|---|---|---|
| 5,867,448 A * | 2/1999 | Mann ........................ | 365/233 |
| 6,125,419 A * | 9/2000 | Umemura et al. .......... | 710/110 |
| 6,142,830 A | 11/2000 | Loeffler ...................... | 439/620 |
| 6,356,502 B1 * | 3/2002 | Yi ........................... | 365/230.06 |
| 6,449,213 B1 * | 9/2002 | Dodd et al. ................ | 365/233 |
| 6,530,006 B1 * | 3/2003 | Dodd et al. ................ | 711/167 |
| 2004/0105292 A1 * | 6/2004 | Matsui ........................ | 365/63 |

FOREIGN PATENT DOCUMENTS

EP    1 069 509 A2    1/2001

\* cited by examiner

*Primary Examiner*—Tan T. Nguyen
(74) *Attorney, Agent, or Firm*—Dicke, Billig & Czaja, PLLC

(57) ABSTRACT

The invention relates to a semiconductor memory module having at least one memory chip and a buffer chip, which drives clock, address and command signals to the memory chip and drives data signals to, and receives them from, the memory chip via a module-internal clock, address, command and data bus. The buffer chip forms an interface to an external memory main bus. The data bus lines and/or the clock, command and address bus lines are respectively connected to the buffer chip at their two ends and are capable of being driven by the buffer chip from these two ends. Control means are being provided and set up in such a manner that they respectively match the directions of propagation of the data signals and of the clock, command and address signals on the corresponding bus lines during writing and reading.

10 Claims, 4 Drawing Sheets

SEMICONDUCTOR MEMORY MODULE

CROSS-REFERENCE TO RELATED APPLICATIONS

This Utility Patent Application claims priority to German Patent Application No. DE 103 30 811.3, filed on Jul. 8, 2003, which is incorporated herein by reference.

BACKGROUND

The invention relates to a semiconductor memory module having at least one memory chip and a buffer chip, which drives clock, address and command signals to the memory chip and drives data signals to, and receives them from, the memory chip via a module-internal clock, address, command and data bus, the buffer chip forming an interface to an external memory main bus.

So-called buffer chips will become necessary in future for very fast and high-density memory architectures such as, for example, DDR-III DRAMs. FIG. 1 illustrates a memory system of this type, in which the buffer chips 110, 210 which are situated on respective memory modules 100, 200 are connected in concatenated fashion to a memory main bus 400, which leads to a memory controller 300. On the buffer chips 110, 210, a switching arrangement S ensures that data are read from, or written to, the respectively addressed memory module 100 or 200 only. The Roman numerals I, II, III and IV are used to designate individual memory groups each having a plurality of memory chips which are located one behind the other in a row on the memory modules 100 and 200. The buffer chips 110, 210 convert the so-called "stub bus", as is used nowadays in DDR and DDR-II systems, into a type of hierarchical bus system in which only point-to-point or point-to-two-point connections now occur. Connections of this type allow data transfer rates of well above one Gbps. In addition, cascading allows the concatenation of a large number of buffer chips and the realization of memory systems having a very large number of memory chips on just one memory main bus 400.

FIG. 2 illustrates in the form of a diagrammatic layout view, the manner in which a memory module (DIMM) having a buffer chip 110 (HUB) and eight memory chips can be internally constructed. Clock signal lines, which are depicted by dash-dotted lines, and command and address bus lines (C/A), which are depicted by dashed lines, are driven centrally by the buffer chip 110, successively routed to the memory chips 101, 102, . . . 108 (DRAMs) in a so-called fly-by topology and terminated at the end by means of terminations a1, a2, b1, b2 in order to avoid signal reflections. The data bus lines (DQ) (illustrated by means of solid lines in FIG. 2) of the DRAMs are connected to the buffer chip 110 separately in the form of point-to-point connections.

The propagation time of the signals on the abovementioned connecting lines will play a significant part at the high frequencies at which future computer systems, and thus the memory systems thereof, will be operated. 200 ps for each path (buffer chip to DRAM and DRAM to DRAM) shall respectively be assumed below for said propagation time. All signals (CLK, C/A, DQ, DQS) therefore require 200 ps in order to pass from the buffer chip 110 to the first DRAM (for example 104) and 800 ps in order to pass from the buffer chip 110 to the fourth DRAM (for example 101). Since the clock signal CLK and the command and address signal C/A have the same propagation time, commands and addresses can be transmitted without any problems from the buffer chip 110 to the respective DRAM chip. The same applies to the transmission of write data (DQ, DQS) to the DRAMs. From the point of view of the overall system, the fact that the actual write operation in the DRAMs respectively takes place at a different time is only of secondary importance.

If data are to be read from the DRAMs, the following problem arises: the DRAM chips receive the read command at different times on account of the propagation times of the CLK signals and the C/A signals on the bus. The difference between the first and the last DRAM is 600 ps in our example. After a certain amount of time, which shall be assumed to be the same for all DRAMs, the DRAM chips begin to send their data back to the buffer chip 110. The propagation time from the DRAM chip to the buffer chip now again depends on the position of the DRAM chip on the memory module (DIMM), the propagation time in the case of this arrangement being longest for that DRAM chip which received the command last. The data will therefore arrive at the buffer chip 110 in a temporally offset manner, to be precise in a manner respectively offset by twice the propagation time from the buffer chip 110 to the DRAM chip. 1200 ps=1.2 ns therefore elapse from the first data items to the last data items.

This time offset in the read data either limits the maximum operating frequency to values which are decidedly less than 800 MHz (=1.125 ns) or must be compensated for by means of a complicated circuit in the buffer chip, which will lead to the data being delayed further since the earliest data can be forwarded in a manner delayed by at least 1.2 ns plus the processing time of the compensating circuit.

SUMMARY

In one embodiment, the invention is a memory module of the type mentioned initially such that the unavoidable time differences for command and address signals and for the write/read data are compensated for.

In one embodiment of the invention the direction of travel of the command and address signals and also of the clock signals is matched to the direction of travel of the signals on the DQ bus. Alternatively, the direction of travel of the DQ signals is matched to the direction of travel of the command and address signals and of the clock signals, when reading from the DRAMs. Accordingly, a semiconductor memory module according to one embodiment of the invention is distinguished by the fact that the data bus lines and/or the clock, command and address bus lines are respectively connected to the buffer chip at their two ends and can be driven by the buffer chip from these two ends. Control means are provided and set up in such a manner that they respectively match the directions of propagation of the data signals and of the clock, command and address signals on the corresponding bus lines during writing and reading.

If the buffer chip is connected to both ends of the DQ bus, during a write operation it can drive the data from the same end as that at which clock signals and command/address signals are also driven. This means that the data arrive at the memory chip in synchronism with the clock signal. During a read operation, the data are now no longer read at said end of the DQ bus but rather at the other end, with the result that clock, command, address and read data DQ move in the same direction. Since the buffer chip cannot physically be located at both ends of a linear bus, the DQ bus is, for this purpose, closed or folded to form a loop on the memory module.

Alternatively, the command/address bus can be driven at both ends and the data bus can be connected on only one side. In this case, the command/address signals are driven from the same end as the data signals on the data bus lines during writing and at the other end during reading. In both alternative cases, the data move in the same direction as the command/address signals during writing and reading. During a read operation, this results in the data arriving at the buffer chip at virtually the same time. The data reception stage of the latter can therefore be constructed in a much simpler manner and the system can be operated at considerably higher frequencies.

In one embodiment of the invention, it is also possible to connect both the data signal lines and the clock, command and address lines to the buffer chip at both ends.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
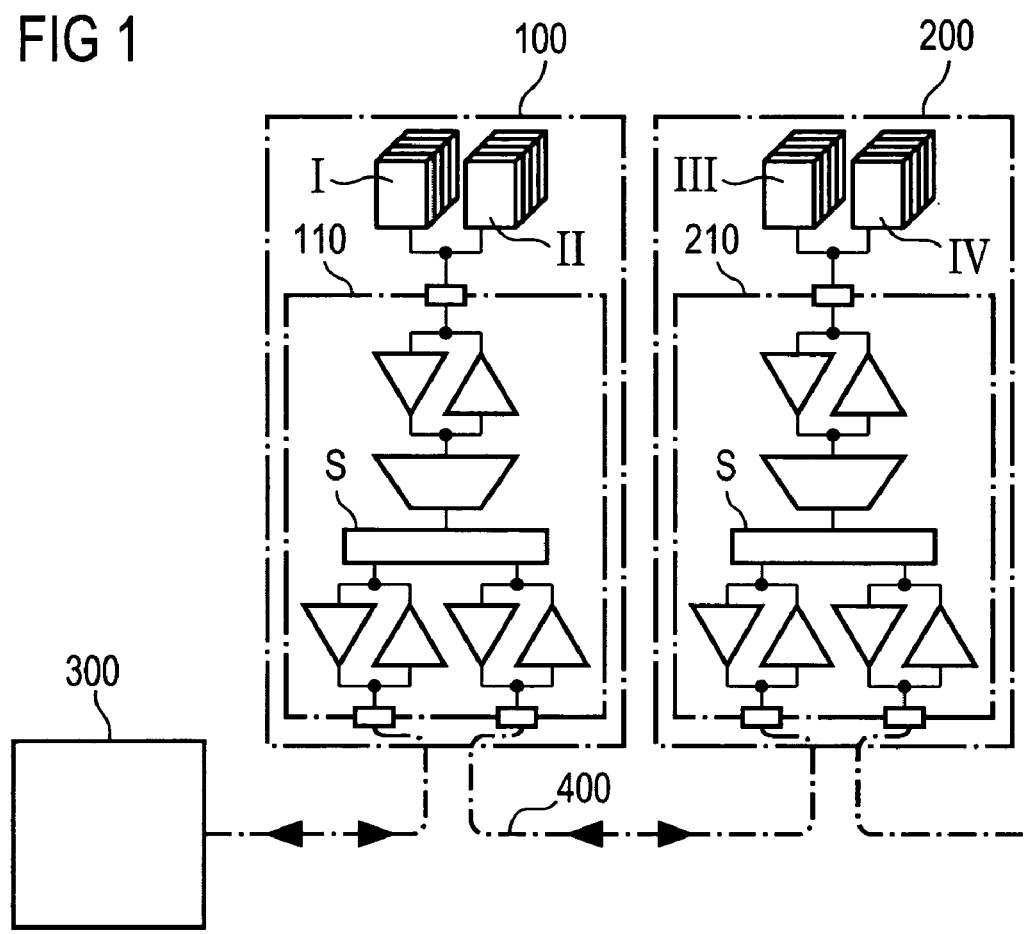
FIG. 1 illustrates the topology of a conventional memory system having concatenated buffer chips.
Figure 2:
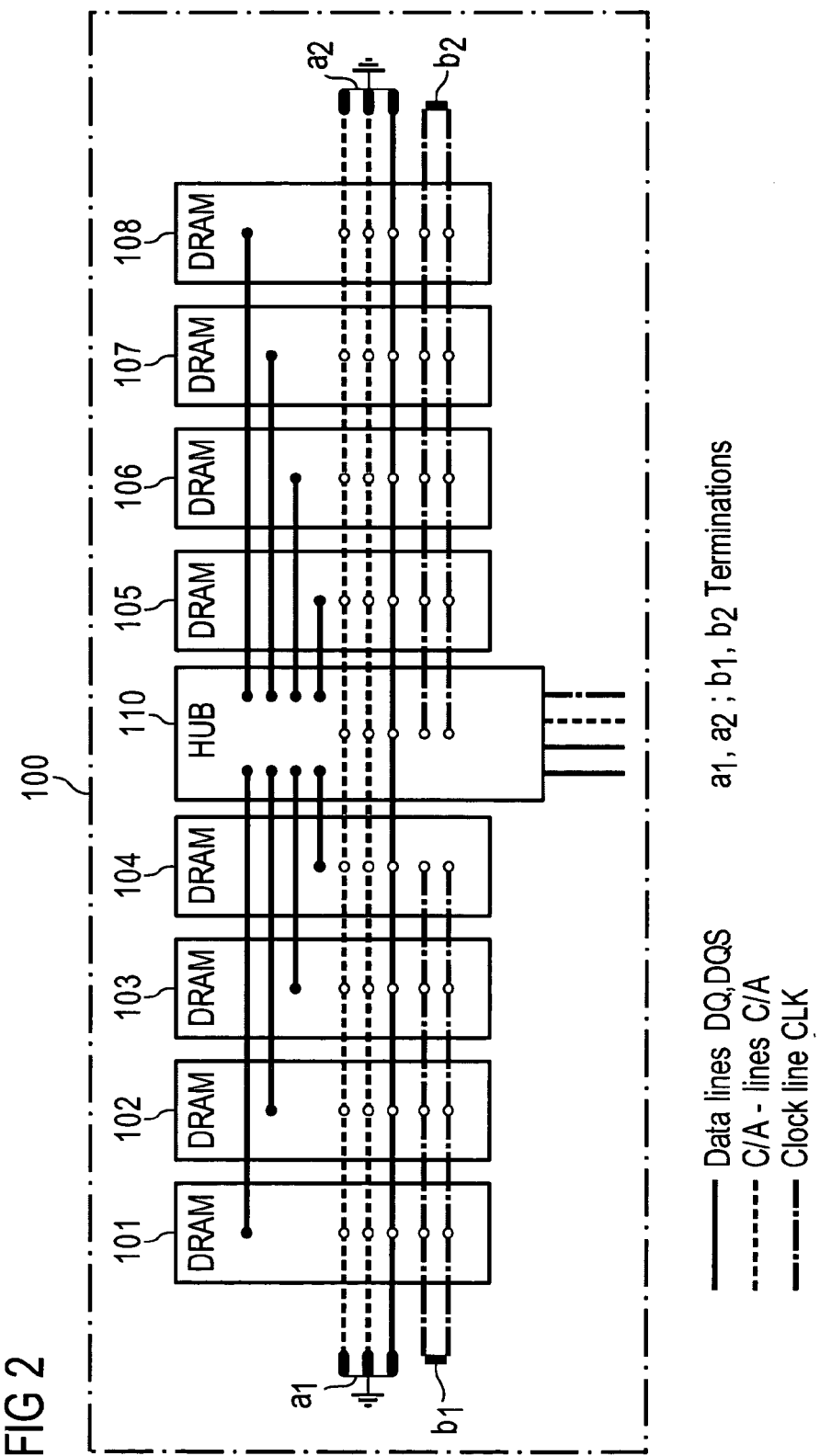
FIG. 2 illustrates the diagrammatic layout view of a conventional semiconductor memory module having a buffer chip and eight memory chips.
Figure 3:
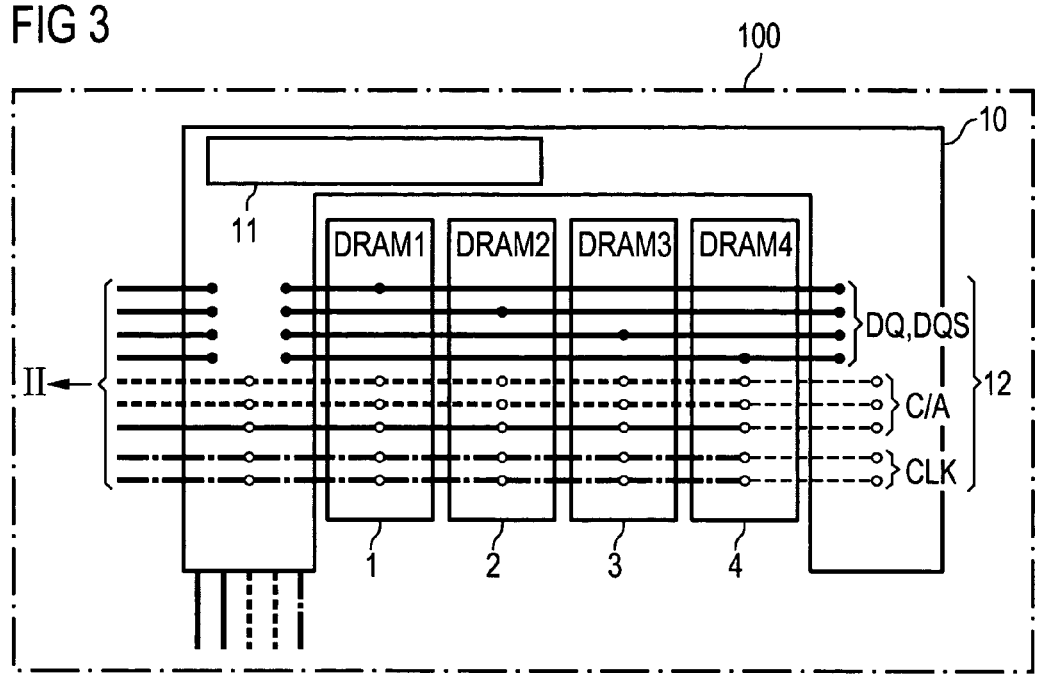
FIG. 3 diagrammatically illustrates a layout view of a semiconductor memory module according to the invention having a buffer chip and a loop bus via four memory chips which are arranged one behind the other in a row.

In FIG. 3, which illustrates a diagrammatic layout view of a semiconductor memory module 100 according to the invention, the data bus lines DQ, DQS of, for example, four memory chips (designated by the reference numerals 1, 2, 3 and 4) are connected according to the invention to a single buffer chip 10 at both ends. The fact that the command and address bus lines C/A and also the clock lines CLK of the module-internal bus 12 can also be connected to the buffer chip 10 on both sides is indicated by means of dashed lines. In order to establish or reverse the direction of propagation or travel of the data signals DQ, DQS relative to the command and address signals C/A and the clock signals CLK, the buffer chip 10 has a control device 11, which, in an alternative embodiment, ensures that the clock signal CLK, command and address signals C/A and data signals DQ, DQS move in the same direction when writing data. That is, during the write operation, the control device 11 situated in the buffer chip 10 ensures that the data bus lines DQ, DQS are driven at that end which coincides with the driving end of the clock bus lines CLK and of the command and address bus lines.

In the case of a read operation, the control device 11 also ensures that the clock signals CLK and the command and address signals C/A and data signals DQ, DQS likewise move in the same direction, that is, the data at the buffer chip 10 are received at the other end of the DQ bus loop. In this case, the temporal offset between the memory chips is precisely compensated for again during command reception by the different propagation times of the data along the loop. The respective non-driven end of the data bus lines DQ, DQS is terminated, in particular actively terminated, by the buffer chip 10 in order to avoid signal reflections at the end of the lines.

As already mentioned, clock lines CLK and command and address lines C/A may likewise be routed back to the buffer chip 10 in the manner of a loop. The data bus lines DQ/DQS may also alternatively be connected to the buffer chip 10 on only one side if both ends of the command and address lines C/A are connected to the buffer chip 10. In this case, for read commands, the direction of propagation or travel of signals on the clock lines CLK and on the command and address lines C/A is reversed, that is, the latter are driven at that end which is opposite to the DQ end of the loop.

Figure 4A:
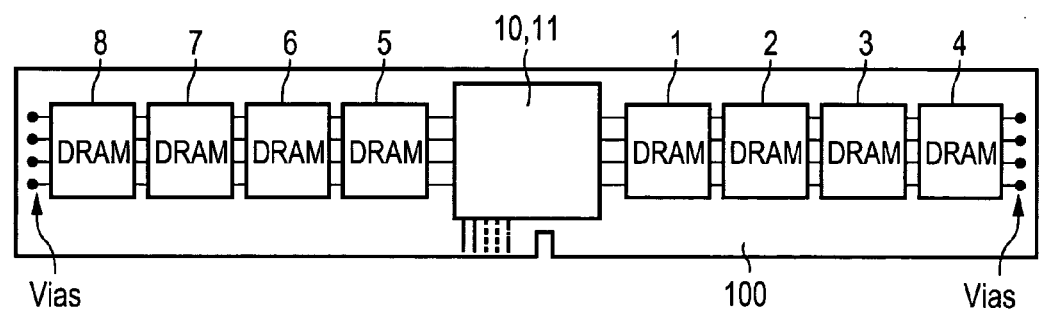
FIGS. 4A and 4B respectively illustrate a diagrammatic plan view and a sectional view of a DIMM semiconductor memory module for the purpose of illustrating the physical realization of the loop bus via a plurality of memory chips on the front and rear sides of the DIMM memory module and with vias on the edge of the latter.
Figure 4B:
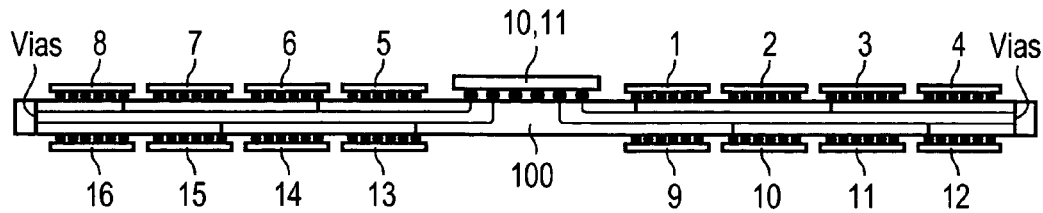

It has already been mentioned that a semiconductor memory module according to the invention can be realized in the form of a DIMM module. For example, 16 DRAM chips, in particular DDR DRAM chips, can be provided, together with the buffer chip 10, on the semiconductor memory module. FIG. 4A illustrates a diagrammatic plan view of one side of such a DIMM semiconductor memory module 100, which has been fitted with DRAMs and a buffer chip 10. In the physical realization, connecting lines are first of all routed from the buffer chip 10 to a plurality of DRAMs 1–8 on one side of the semiconductor memory module and are then plated through, by means of vias, to the other side where they are connected to further DRAM chips 9–16 and routed back to the buffer chip 10. This results, for the bus lines, in a closed loop having a start and end point on the buffer chip 10. This is clearly illustrated in the sectional illustration of FIG. 4B.

Figure 5:
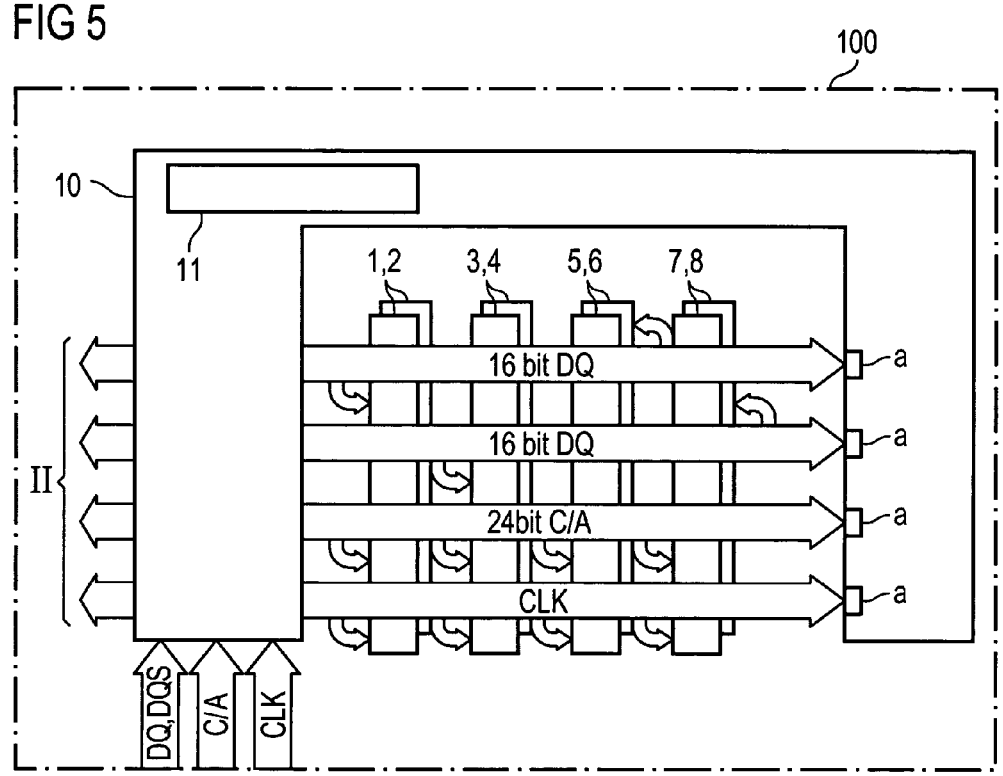
FIG. 5 diagrammatically illustrates a semiconductor memory module in accordance with the invention for the purpose of illustrating the flow of data via the loop bus.

FIG. 5 illustrates the flow of data on a semiconductor memory module according to the invention, in particular a DIMM module having a loop bus according to the invention. It becomes clear here that the problem mentioned initially is solved by means of the proposed arrangement of a semiconductor memory module 100 since the data always move in the same direction as the commands both when reading and writing data. In the case of reading, they therefore arrive at the buffer chip at virtually the same time. a is used to designate the (active) terminations.

It should also be mentioned that, in the semiconductor memory modules illustrated in FIGS. 3 and 5, the buffer chip 10 is illustrated in a U-shaped manner merely for the purposes of simplification, as a result of which it was possible to avoid a confusing illustration of loops of a large number of parallel lines. In addition, the Roman numeral II is used in FIGS. 3 and 5 to indicate the connection to the other side of the module.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory module comprising:
   at least one memory chip;
   a buffer chip which drives clock, address, and command signals to the memory chip and drives data signals to, and receives them from, the memory chip via module-internal clock, address, command and data bus lines, the buffer chip forming an interface to an external memory main bus;
   wherein the data bus lines or the clock, command and address bus lines are respectively connected to the buffer chip at their two ends and can be driven by the buffer chip from these two ends; and
   control means for respectively matching directions of propagation of the data signals and of the clock, command and address signals on the corresponding bus lines during writing and reading.

2. The semiconductor memory module of claim 1, wherein only the data bus lines are connected to the buffer chip at their two ends, and the buffer chip, during a write operation, drives the write data signals from that end of the data bus line from which it also drives the clock, command and address signals and, during a read operation, receives the read data signals at the other end of the data bus lines.

3. The semiconductor memory module of claim 1, wherein only the clock, command and address bus lines are connected to the buffer chip at their two ends, and said buffer chip, during a write operation, drives the clock, command and address signals from that end of the clock, command and address bus lines at which the data signals are also driven and, during a read operation, drives the clock, command and address signals from the other end of the corresponding bus lines.

4. The semiconductor memory module of claim 3, wherein the buffer chip furthermore has termination means which respectively terminate the bus lines at an input-side end thereof.

5. The semiconductor memory module of claim 4 wherein the termination means can be actively controlled.

6. The semiconductor memory module of claim 1, wherein a plurality of memory chips that are arranged one behind the other in a row are connected to the one buffer chip by means of the module-internal bus.

7. The semiconductor memory module of claim 1, wherein the memory chips are chips that are operated at a multiple data rate, in particular DDR DRAM chips, and the data signals contain a data strobe signal.

8. The semiconductor memory module of claim 1, wherein the data bus lines and the clock, command and address lines are respectively connected to the buffer chip at their two ends.

9. The semiconductor memory module of claim 1 wherein the data bus lines and the clock, address and command bus lines are respectively connected at their two ends to the buffer chip.

10. The semiconductor memory module of claim 1, wherein the control means is implemented in the buffer chip.

* * * * *